United States Patent
Furuta

(10) Patent No.: US 8,445,943 B2
(45) Date of Patent: May 21, 2013

(54) SEMICONDUCTOR INTEGRATED CIRCUIT DEVICE

(75) Inventor: Hiroshi Furuta, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 246 days.

(21) Appl. No.: 13/010,191

(22) Filed: Jan. 20, 2011

(65) Prior Publication Data

US 2011/0175197 A1    Jul. 21, 2011

(30) Foreign Application Priority Data

Jan. 21, 2010  (JP) ................. 2010-011244

(51) Int. Cl.
*H01L 29/72* (2006.01)

(52) U.S. Cl.
USPC ........... 257/206; 257/371; 257/374; 257/509; 257/544; 257/E27.108; 257/E29.019

(58) Field of Classification Search
USPC ............. 257/206, 210, 371, 374, 509, 544, 257/E27.108, E29.019
See application file for complete search history.

(56) References Cited

U.S. PATENT DOCUMENTS

| 6,870,231 B2 * | 3/2005 | Kim et al. ............. 257/379 |
| 6,909,135 B2 | 6/2005 | Nii et al. |
| 7,973,371 B2 * | 7/2011 | Furuta et al. ............. 257/393 |

FOREIGN PATENT DOCUMENTS

JP    2002-353413 A    12/2002

OTHER PUBLICATIONS

Mark P. Baze et al., A Digital CMOS Design Technique for SEU Hardening, IEEE Transactions on Nuclear Science, vol. 47, No. 6, Dec. 2000, pp. 2603-2608.

\* cited by examiner

*Primary Examiner* — Minh-Loan T Tran
(74) *Attorney, Agent, or Firm* — Foley & Lardner LLP

(57) ABSTRACT

A semiconductor integrated circuit device includes: a plurality of data holding circuits; and a plurality of wells. The plurality of data holding circuits is provided in a substrate of a first conductive type. Each of the plurality of data holding circuits includes a first well of the first conductive type and a second well of a second conductive type different from the first conductive type. The plurality of wells is arranged in two directions for the each of the plurality of data holding circuits.

20 Claims, 15 Drawing Sheets

Fig. 3

| A | B | C | f |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

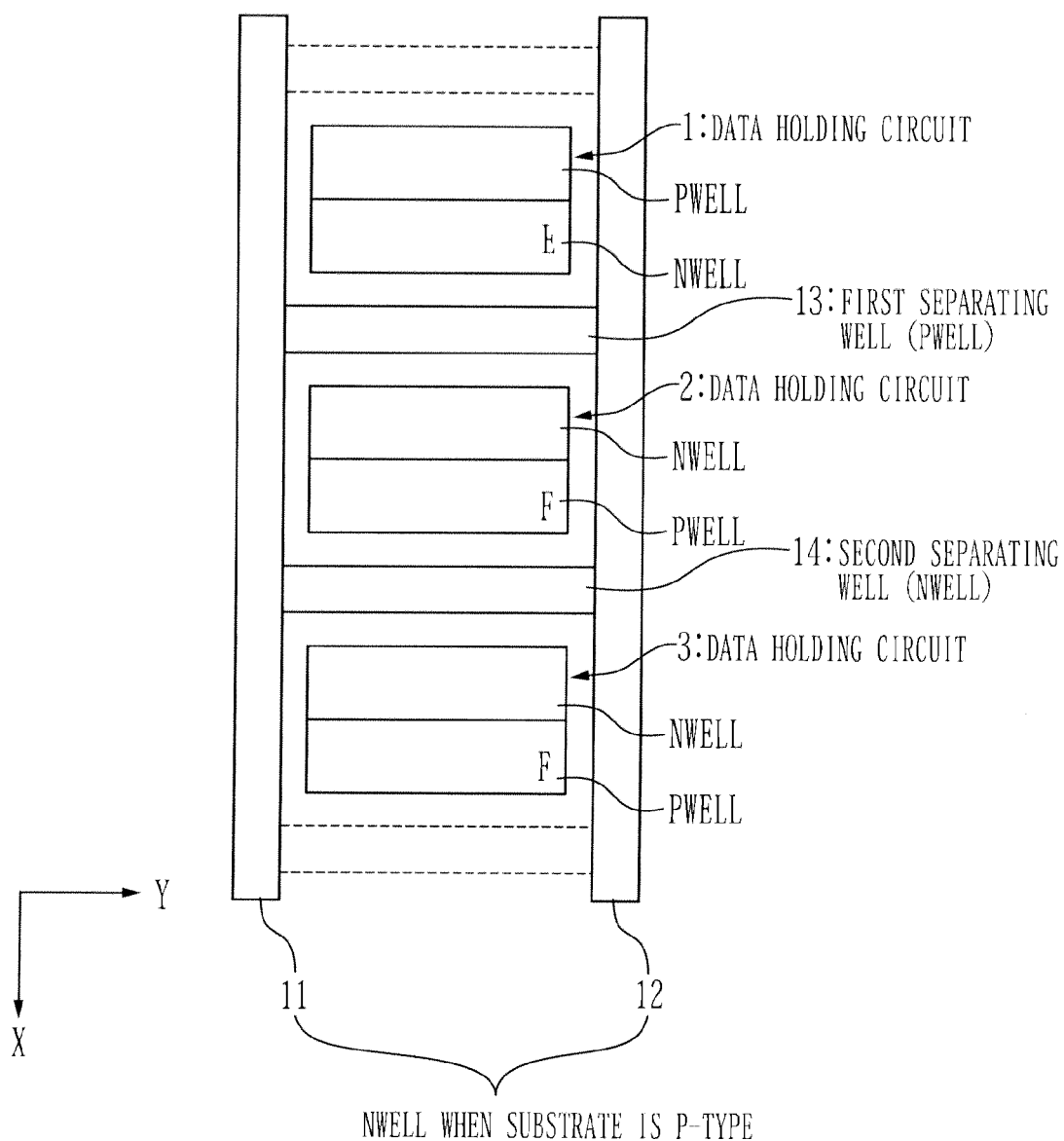

SEMICONDUCTOR INTEGRATED CIRCUIT DEVICE

INCORPORATION BY REFERENCE

This application is based upon and claims the benefit of priority from Japanese patent application No. 2010-011244 filed on Jan. 21, 2010, the disclosure of which is incorporated herein in its entirety by reference.

BACKGROUND OF THE INVENTION

1. Field of the Invention

The present invention relates to a semiconductor integrated circuit device that includes a plurality of data holding circuits (flip-flop circuits/latch circuits and the like) for holding data.

2. Description of Related Art

In association with a finer structure and a lower voltage, a software error of a logic circuit, namely, a logic inversion of a data holding circuit and an erroneous data transfer at a time of a signal transmission (Single Event Transient) has become problematic. So, a countermeasure is carried out by connecting a coincidence circuit or a majority logic circuit to the outputs of a plurality of data holding circuits.

However, there is a case that SEU (Single Event Upset/SET (Single Event Transient) of the coincidence circuit itself or the majority logic circuit itself becomes problematic. Therefore, it is important to protect the plurality of data holding circuits from being logically inverted at the same time.

As the related art of the present invention, a technique for improving the SEU resistances of the data holding circuit and the majority logic circuit is disclosed in, for example, "A Digital CMOS Design Technique for SEU Hardening", written by Mark P. Baze, Steven P. Buchner and Dale McMorrow, IEEE Transactions on Nuclear Science, Vol. 47, No. 6, pp. 2603~2608, 2000 (non-patent literature 1). In the non-patent literature 1, a transistor is added to the data holding circuit so that the logic inversion is unlikely to occur. FIG. 11 and FIG. 10 in the non-patent literature 1 show countermeasure examples for the data holding circuit (latch circuit) and the majority logic circuit, respectively.

Also, as a method of protecting carriers, which are directly or indirectly generated by radioactive rays, from being collected into a node diffusion layer, an idea for providing a dummy well between a memory cell and a memory cell is proposed in Japanese Patent Publication No. JP-P 2002-353413A (patent literature 1), especially in FIG. 4 in the patent literature 1. The preparation of the foregoing dummy well protects two cells from being inverted at the same time.

The inventor has now discovered the following facts. In the non-patent document 1, the transistor is added to the data holding circuit so that the logic inversion is unlikely to occur. However, there is a problem that a layout area is increased, and there is another problem that the number of the designing steps is increased in order to satisfy specifications (timing) in some cases depending on a circuit configuration.

The fact that the data holding circuits are logically inverted at the same time is exactly equal to the fact that two bits of the memory cells are inverted at the same time. The area of the node diffusion layer in the transistor that configures the data holding circuit in a recent product whose power source voltage is about 1V is similar to the area of the node diffusion layer of the SRAM in the generation of a little while ago. Thus, there is a possibility that the data holding circuits are logically inverted at the same time. The patent literature 1 describes the technique that protects the carriers from being injected into the node diffusion layer in the memory cell, by providing the dummy well between the memory cell and the memory cell. However, there is no countermeasure against a case that a neutron is incident on a Si substrate so that a nuclear reaction causes two or more kinds of ions to be generated at the same time.

SUMMARY

The present invention seeks to solve one or more of the above problems, or to improve upon those problems at least in part.

In one embodiment, a semiconductor integrated circuit device according to the present invention includes: a plurality of data holding circuits; and a plurality of wells. The plurality of data holding circuits is provided in a substrate of a first conductive type. Each of the plurality of data holding circuits includes a first well of the first conductive type and a second well of a second conductive type different from the first conductive type. The plurality of wells is arranged in two directions for the each of the plurality of data holding circuits.

With such configuration of the semiconductor integrated circuit device according to the present invention, even if one charged particle or one ion moves in one direction to affect two data holding circuits, charges can be collected by at least one of the plurality of wells arranged in the direction. Thus, a software error occurrence can be suppressed.

Moreover, with the above configuration, even if two charged particles or two ions simultaneously move in two directions to affect two data holding circuits, charges can be collected by at least two of the plurality of wells arranged in the directions. Thus, a software error occurrence can be suppressed.

In this way, according to the semiconductor integrated circuit device according to the present invention, the plurality of wells is arranged in two directions for the each of the plurality of data holding circuits so that the plurality of wells collect the charges (carriers) generated between the plurality of data holding circuits. Thus, it is possible to reduce the carriers injected into the plurality of data holding circuits. Hence, even if a neutron is incident on a Si substrate so that a nuclear reaction causes two or more kinds of ions to be generated at the same time, the plurality of wells can suppress the charges from being injected into the plurality of data holding circuits simultaneously (simultaneous charge collection at the node diffusion layers in the plurality of data holding circuits), and the probability that the logics are inverted simultaneously can be reduced.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 3 is a truth table showing operations of the semiconductor integrated circuit device according to the embodiment of the present invention;

FIG. 8B shows an arrangement of data holding circuits, a separating well (first and second separating wells) and an assistant well (first and second assistant wells) in a semiconductor integrated circuit device according to a fifth embodiment of the present invention;

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A semiconductor integrated circuit device according to embodiments of the present invention will be described below in detail with reference to the attached drawings.

Figure 1A:
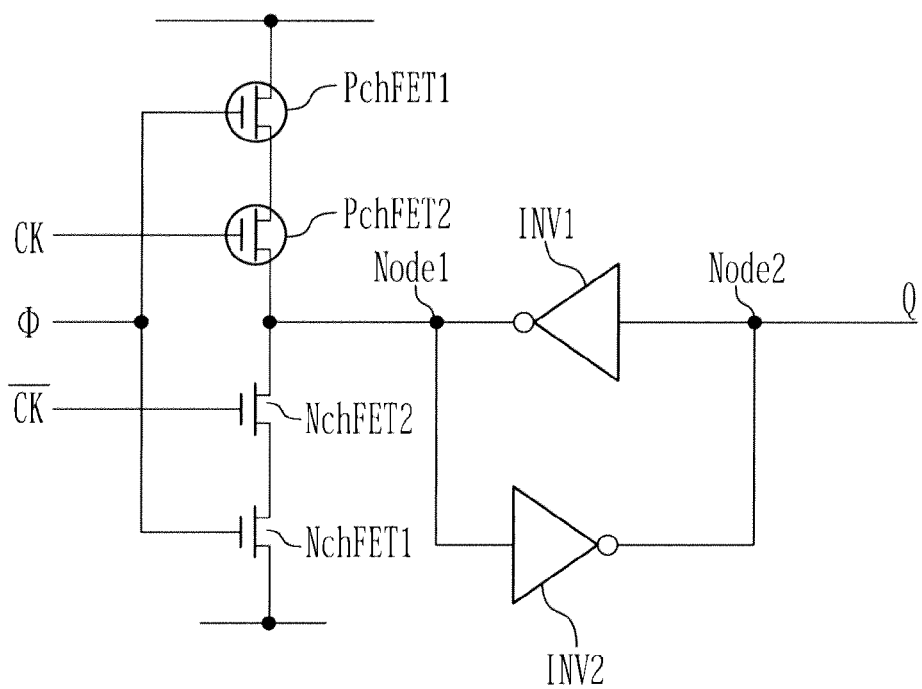
FIG. 1A is a circuit diagram showing a configuration of a data holding circuit.
Figure 1B:
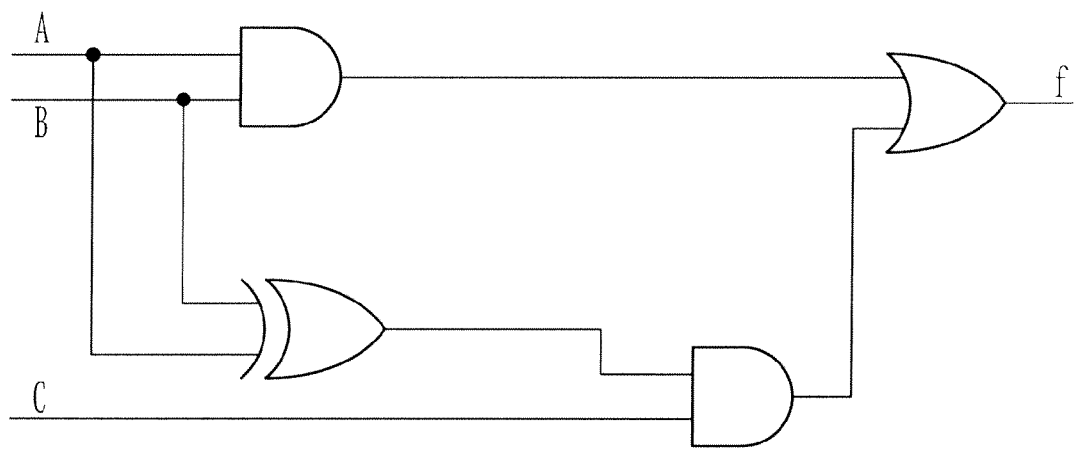
FIG. 1B is a circuit diagram showing a configuration of a 3-input majority logic circuit.
Figure 2:
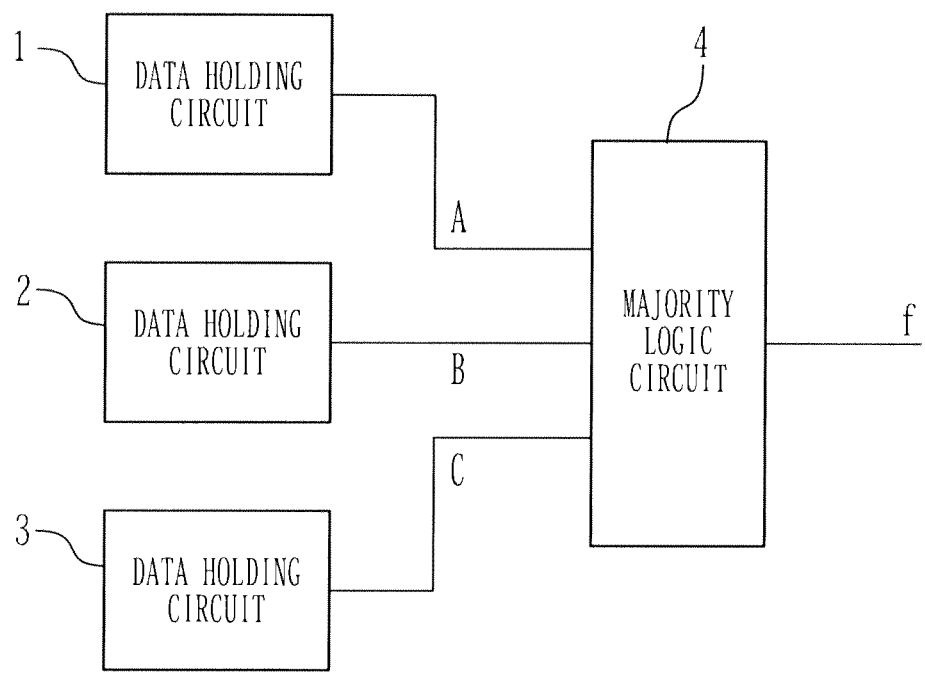
FIG. 2 is a block diagram showing a configuration of a semiconductor integrated circuit device according to an embodiment of the present invention.

FIG. 1A is a circuit diagram showing a configuration of a data holding circuit. FIG. 1B is a circuit diagram showing a configuration of a 3-input majority logic circuit. FIG. 2 is a block diagram showing a configuration of a semiconductor integrated circuit device according to the embodiment of the present invention. FIG. 3 is a truth table showing operations of the semiconductor integrated circuit device according to the embodiment of the present invention.

As shown in FIG. 2, the semiconductor integrated circuit device according to the embodiment of the present invention includes a plurality of data holding circuits and a coincidence circuit or a majority logic circuit. For example, it is assumed that the three data holding circuits in the plurality of data holding circuits are referred to as the first to third data holding circuits (hereafter, referred to as the data holding circuits 1 to 3), respectively. In this case, it is assumed that the majority logic circuit is the 3-input majority logic circuit (hereafter, referred to as the majority logic circuit 4), and is connected to the data holding circuits 1 to 3.

As shown in FIG. 1A, each of the data holding circuits 1 to 3 is the flip-flop circuit and includes transistors PchFET1, PchFET2, NchFET1 and NchFET2 and inverters INV1 and INV2. The transistors PchFET1, PchFET2, NchFET1 and NchFET2 are MOSFET (Metal Oxide Semiconductor Field Effect Transistor) or MISFET (Metal Insulator Semiconductor Field Effect Transistor). The transistors PchFET1 and PchFET2 are the P-type (or, also referred to as the first conductive type) transistors. The transistors NchFET1 and NchFET2 are the N-type (or, referred to as the second conductive type) transistors. Also, not shown here, the inverters INV1 and INV2 are composed of the P-type transistors and the N-type transistors which are MOSFETs or MISFETs, respectively.

The transistor PchFET1 is connected between a first power source for supplying a first power source voltage and a node Node1, and an input signal is supplied to its gate. The transistor PchFET2 is connected between the transistor PchFET1 and the node Node1, and a clock signal is supplied to its gate. The transistor NchFET1 is connected between the node Node1 and a second power source for supplying a second power source voltage (ground voltage) lower than the first power source voltage, and an input signal is supplied to its gate. The transistor NchFET2 is connected between the node Node1 and the transistor NchFET1, and a clock signal is supplied to its gate. The gates of the transistor PchFET1 and the transistor NchFET1 are used as an input $\phi$ of each of the data holding circuits 1 to 3. The inverter INV1 is connected to a node Node2 at its input, and is connected to the node Node1 at its output. The inverter INV2 is connected to the node Nodal at its input, and is connected to the node Node2 at its output. The node Node2 is used as an output Q of each of the data holding circuits 1 to 3. For example, the first power source voltage is assumed to indicate a value "1", and the second power source voltage is assumed to indicate a value "0".

As shown in FIG. 1B, the 3-input majority logic circuit 4 includes first and second AND circuits, an XOR circuit and an OR circuit. In the first AND circuit, a signal A and a signal B are supplied to its inputs. In the XOR circuit, the signal A and the signal B are supplied to its inputs. In the second AND circuit, the output of the XOR circuit and a signal C are supplied to its inputs. In the OR circuit the output of the first AND circuit and the output of the second AND circuit are supplied to its inputs. An output signal f of the OR circuit is outputted as an output of the 3-input majority logic circuit. For example, the outputs Qs of the data holding circuits 1 to 3 are assumed to be the signals A, B and C that indicate the value "0" or "1", respectively (refer to FIG. 2).

As shown in FIG. 2, the 3-input majority logic circuit 4 receives the signals A, B and C outputted by the data holding circuits 1 to 3, respectively. Then, as shown in FIG. 3, the 3-input majority logic circuit 4 performs a majority vote on the values indicated by the signals A, B and C. The 3-input majority logic circuit 4 outputs its result as the output signal f.

(First Embodiment)

Figure 5A:
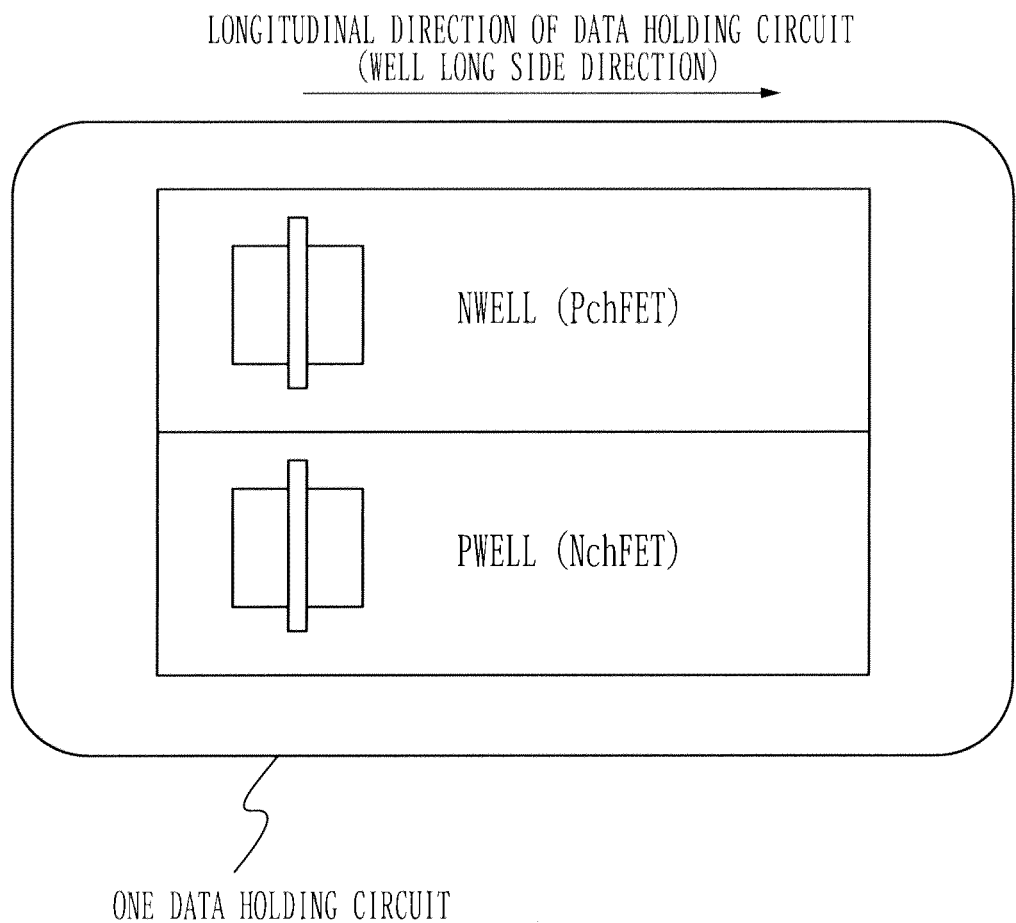
FIG. 5A shows an arrangement of a first well, a second well and gates in the data holding circuit in the semiconductor integrated circuit device according to the embodiment of the present invention.
Figure 5B:
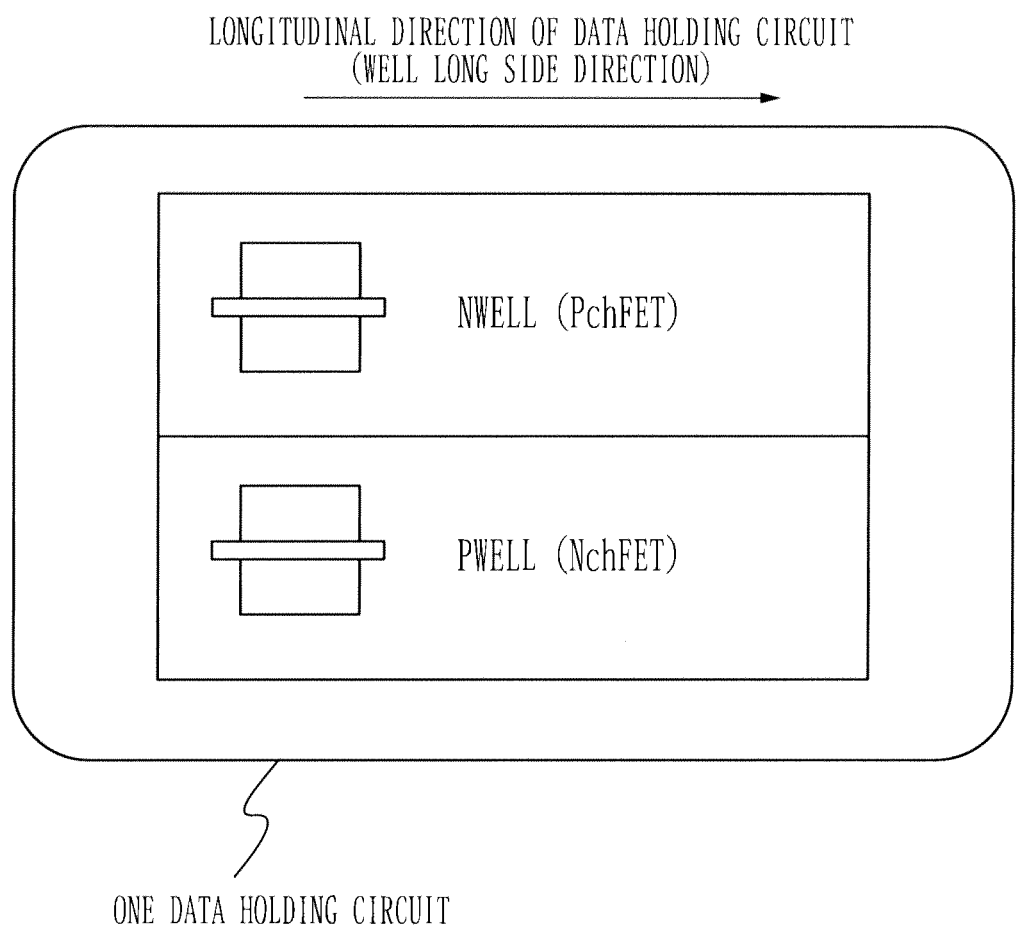
FIG. 5B shows an arrangement of a first well, a second well and gates in the data holding circuit in the semiconductor integrated circuit device according to the embodiment of the present invention.
Figure 6A:
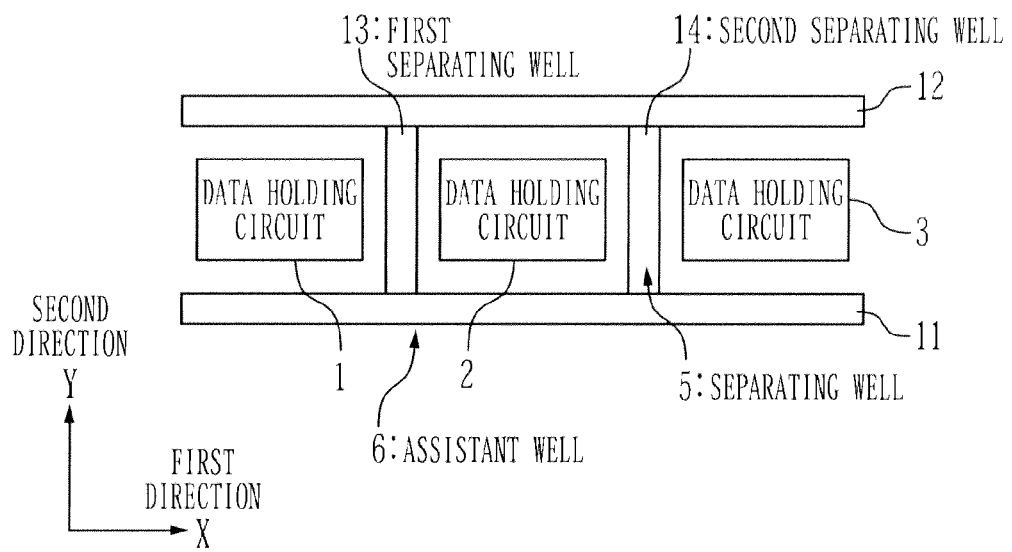
FIG. 6A shows an arrangement of data holding circuits, a separating well and an assistant well in a semiconductor integrated circuit device according to a first embodiment of the present invention.
Figure 9A:
FIG. 9A is a view describing an effect of the present invention.
Figure 9B:
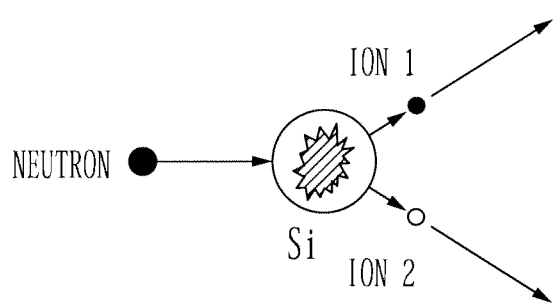
FIG. 9B is a view describing an effect of the present invention.
Figure 10:
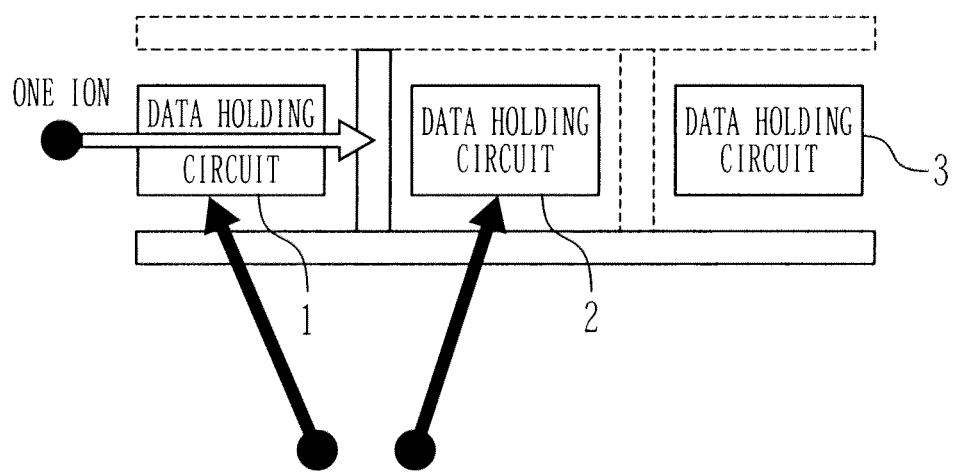
FIG. 10 is a view describing an effect of the present invention.

FIGS. 4A, 4B, 4D, 4E, 4G and 4H are plan views and sectional views showing arrangements of a separating well in the semiconductor integrated circuit device according to the embodiment of the present invention. FIGS. 4C and 4F are plan views and sectional views describing the arrangement of FIG. 4G. FIGS. 5A and 5B show arrangements of the first and second wells and gates of the data holding circuit in the semiconductor integrated circuit device according to the embodiment of the present invention. FIG. 6A shows an arrangement of the data holding circuits 1 to 3, the separating well 5 and an assistant well 6 in the semiconductor integrated circuit device according to the first embodiment of the present invention. FIGS. 9A, 9B and 10 are views describing effects of the present invention.

As shown in FIG. 6A, the semiconductor integrated circuit device according to the first embodiment of the present invention further includes the separating well 5 and the assistant well 6.

Each of the data holding circuits 1 to 3 further includes a P-type first well "PWELL" and an N-type second well "NWELL" that are formed on the surface area of a P-type substrate, and a gates formed on the first well "PWELL" and the second well "NWELL" (refer to FIGS. 4A to 4G and FIGS. 5A, 5B). With the first well "PWELL" and the gate formed thereon, they are used as the above-mentioned transistors PchFET1 and PchFET2. With the second well "NWELL" and the gate formed thereon, they are used as the above-mentioned transistors NchFET1 and NchFET2.

The separating well 5 is formed on the surface area of the substrate and provided between the proximate data holding circuits in the data holding circuits 1 to 3. The assistant well 6 is formed on the surface area of the substrate, connected to the separating wells 5 and provided in a direction different from a direction of the separating well 5 around the data holding circuits 1 to 3.

The assistant well 6 includes a P-type or N-type first assistant well 11 extended in a first direction X parallel to the substrate and a P-type or N-type second assistant well 12 extended in the first direction X. Each of the data holding circuits 1 to 3 is provided between the first assistant well 11 and the second assistant well 12 and arranged linearly along the first direction X.

The separating well 5 is a P-type or N-type well that is arranged in parallel to the substrate and extended to the second assistant well 12 from the first assistant well along a second direction Y orthogonal to the first direction X. Here, the separating well 5 provided between the data holding circuit 1 and the data holding circuit 2 is referred to as a first separating well 13. The separating well 5 provided between the data holding circuit 2 and the data holding circuit 3 is referred to as a second separating well 14.

The arrangement of the separating well 5 will be specifically described below.

Figure 4A:
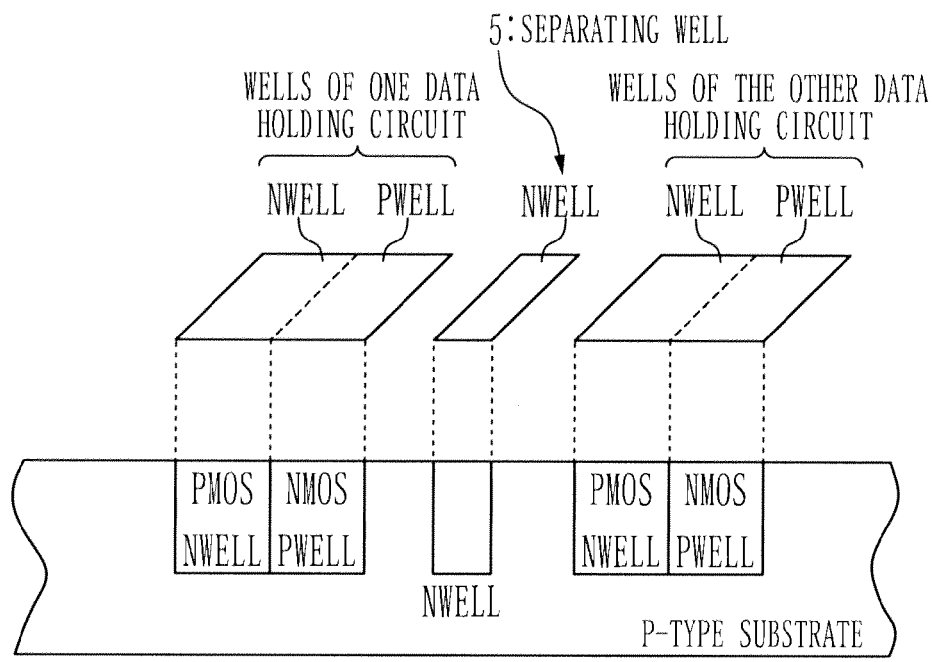
FIG. 4A is a plan view and a sectional view showing an arrangement of a separating well in the semiconductor integrated circuit device according to the embodiment of the present invention.

As shown in FIG. 4A, in the proximate data holding circuits 1 to 2 and the proximate data holding circuits 2 to 3, the two data holding circuits are referred to as one data holding circuit and the other data holding circuit, respectively. In this case, the second well "NWELL" and the first well "PWELL" in the one data holding circuit, the separating well 5, and the second well "NWELL" and the first well "PWELL" in the other data holding circuit are arranged in this order in one direction. Here, the separating well 5 is the N-type well "NWELL" and separately provided between the first well "PWELL" in the one data holding circuit and the second well "NWELL" in the other data holding circuit.

Figure 4B:
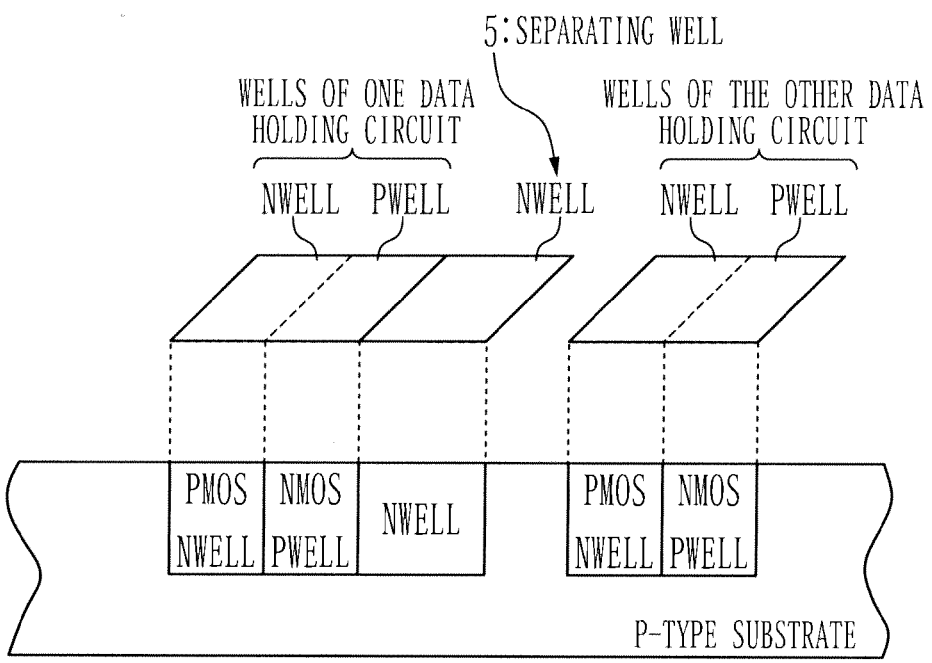
FIG. 4B is a plan view and a sectional view showing an arrangement of a separating well in the semiconductor integrated circuit device according to the embodiment of the present invention.
Figure 4C:
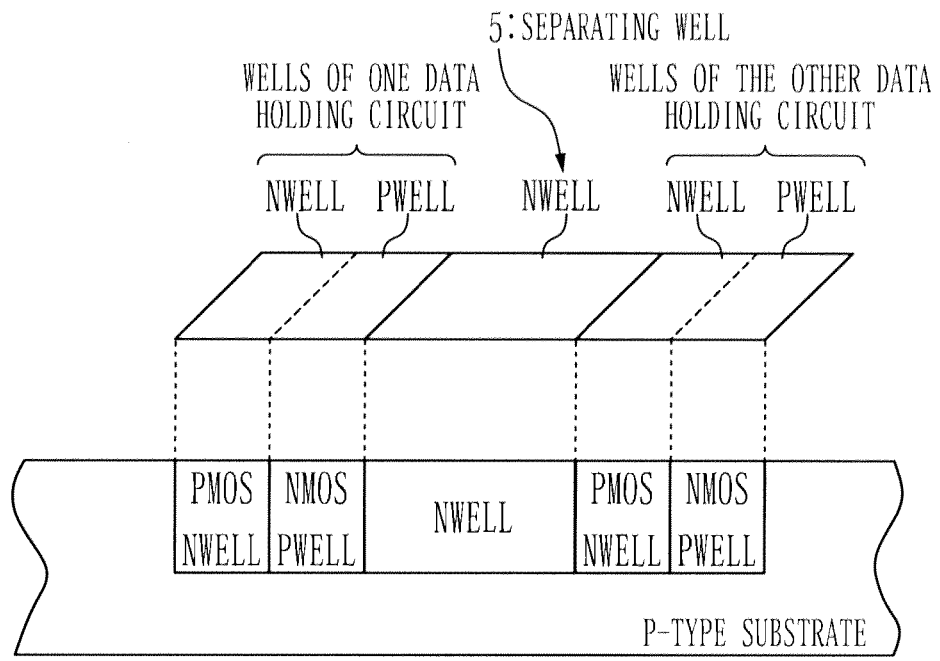
FIG. 4C is a plan view and a sectional view describing an arrangement of FIG. 4G.

Also, as shown in FIG. 4B, the separating well 5 may be the N-type well "NWELL", provided adjacently to the first well "PWELL" in the one data holding circuit and provided separately from the second well "NWELL" in the other data holding circuit.

Figure 4D:
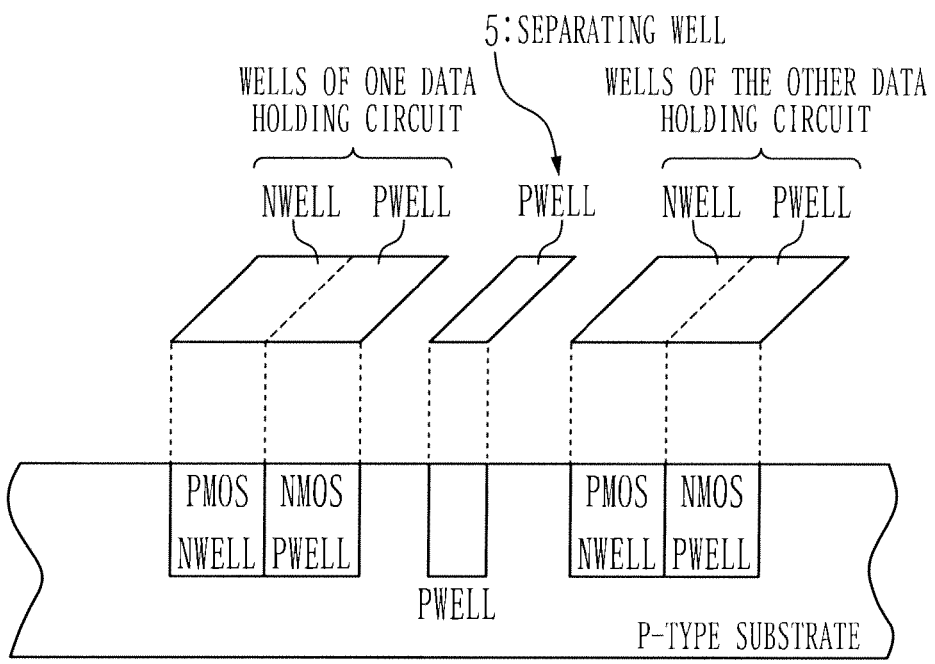
FIG. 4D is a plan view and a sectional view showing an arrangement of a separating well in the semiconductor integrated circuit device according to the embodiment of the present invention.

Also, as shown in FIG. 4D, the separating well 5 may be the P-type well "PWELL", and separately provided between the first well "PWELL" in the one data holding circuit and the second well "NWELL" in the other data holding circuit.

Figure 4E:
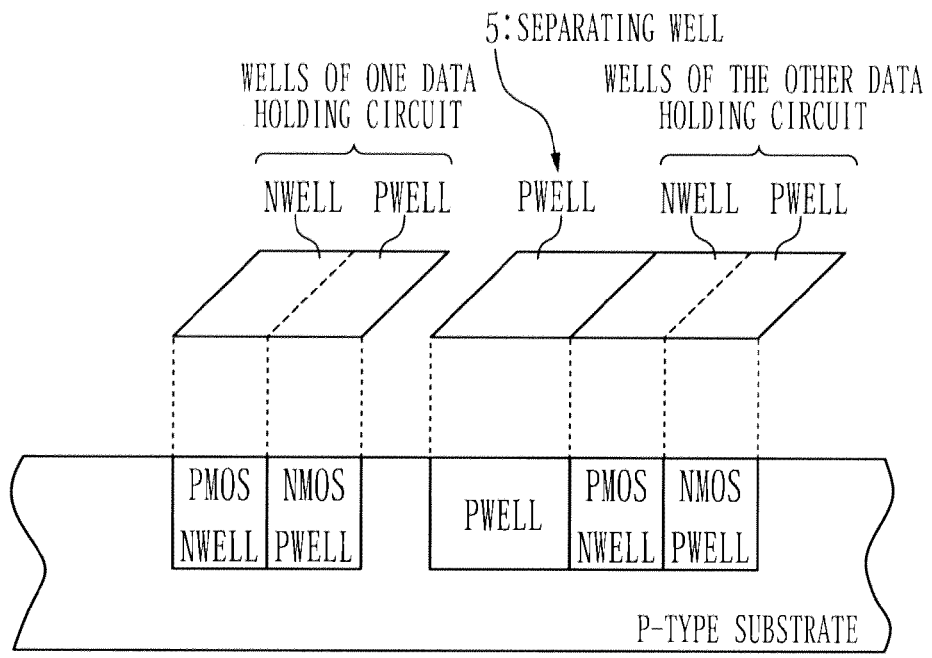
FIG. 4E is a plan view and a sectional view showing an arrangement of a separating well in the semiconductor integrated circuit device according to the embodiment of the present invention.
Figure 4F:
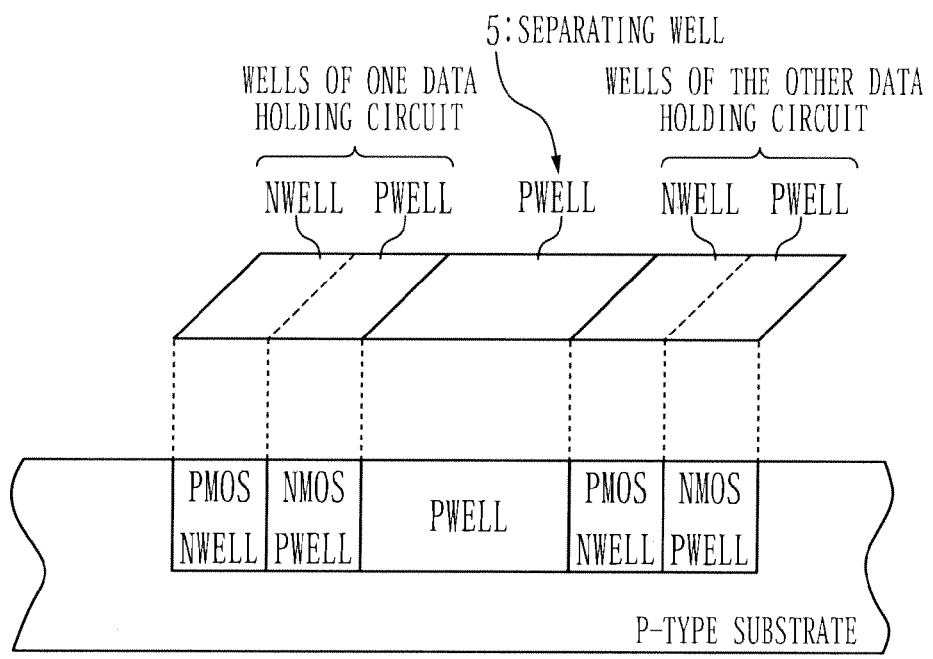
FIG. 4F is a plan view and a sectional view describing an arrangement of FIG. 4G.

Also, as shown in FIG. 4E, the separating well 5 may be the P-type well "PWELL", provided separately from the first well "PWELL" in the one data holding circuit and provided adjacently to the second well "NWELL" in the other data holding circuit.

Also, as shown in FIGS. 4C and 4F, the case may be assumed in which the separating well 5 is adjacent to the first well "PWELL" in the one data holding circuit and the second well "NWELL" in the other data holding circuit. In this case, the separating well 5 faces one of the p-type well "PWELL" and the n-type well "NWELL" having the same conductive type as that of the separating well 5.

Figure 4G:
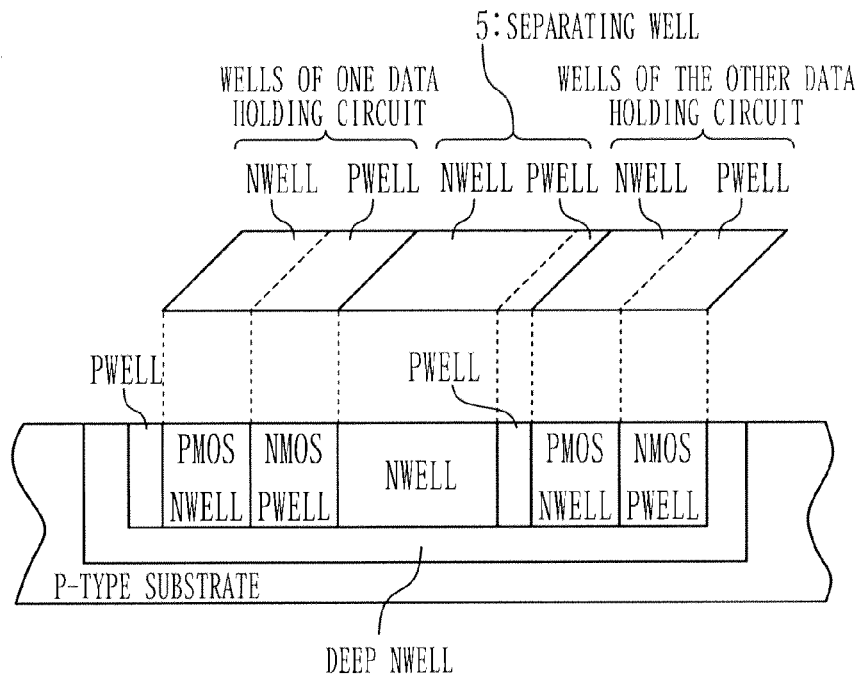
FIG. 4G is a plan view and a sectional view showing an arrangement of a separating well in the semiconductor integrated circuit device according to the embodiment of the present invention.

So, as show in FIG. 4G, in the semiconductor integrated circuit device according to the first embodiment of the present invention, a deep N-type well may be provided for the configuration in FIGS. 4C, 4F. In this case, the semiconductor integrated circuit device according to the first embodiment of the present invention further includes the deep N-type well "NWELL" formed on the surface area of the substrate and the P-type well "PWELL" formed on the surface area of the deep N-type well "NWELL". The first well "PWELL" and the second well "NWELL" in the one data holding circuit and the first well "PWELL" and the second well "NWELL" in the other data holding circuit are formed on the surface area of the deep N-type well "NWELL". The separating well 5 includes a P-type first division well "PWELL" formed on the surface area of the deep N-type well "NWELL" and an N-type second division well "NWELL" formed on the surface area of the deep N-type well "NWELL". So, the P-type well "PWELL", the first well "PWELL" and the second well "NWELL" in the one data holding circuit, the second division well "NWELL", the first division well "PWELL", and the first well "PWELL" and the second well "NWELL" in the other data holding circuit are arranged in this order in one direction.

Figure 4H:
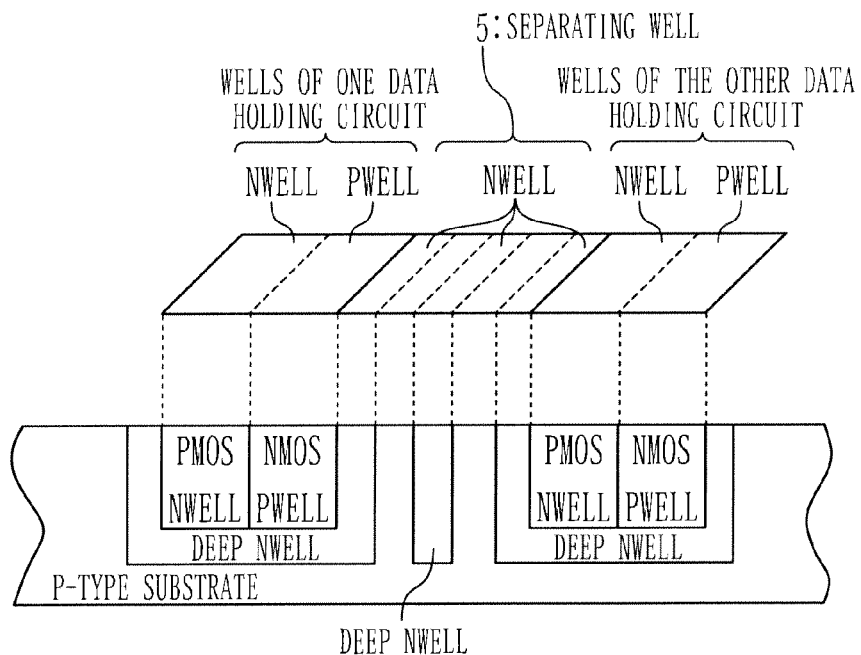
FIG. 4H is a plan view and a sectional view showing an arrangement of a separating well in the semiconductor integrated circuit device according to the embodiment of the present invention.

Also, as shown in FIG. 4H, in the semiconductor integrated circuit device according to the first embodiment of the present invention, the deep N-type well may be divided into plural parts for the one data holding circuit, the separating well 5 and the other data holding circuit with regard to the configurations of FIGS. 4C, 4F. In this case, the semiconductor integrated circuit device according to the first embodiment of the present invention further includes the first to third deep N-type wells "NWELL" separately formed on the surface area of the substrate. The first well "PWELL" and the second well "NWELL" in the one data holding circuit are formed on the surface area of the first deep N-type well "NWELL". The first well "PWELL" and the second well "NWELL" in the other data holding circuit are formed on the surface area of the third deep N-type well "NWELL". The separating well 5 includes not only the second deep N-type wells "NWELL" but also the first deep N-type well "NWELL" and the third deep N-type well "NWELL".

Here, a mechanism in which ions generated by the radioactive rays generate many charges inside the substrate so that the data holding circuits 1 to 3 are logically inverted will be described below with reference to FIGS. 1A and 1B.

As mentioned above, each of the data holding circuits 1 to 3 has the two nodes Node1 and Node2. The inverter INV1 is connected to the node Node2 at its input, and is connected to the node Node1 at its output. The inverter INV2 is connected to the node Node1 at its input, and is connected to the node Node2 at its output. Here, in a case that the level of the output of the inverter INV2 is at a high level (the output Q is at a logic "H"), when electrons generated by ions are injected into the diffusion layer (not shown in FIG. 1A) in the N-type transistor (NMOSFET) configuring the inverter INV2, the potential of this diffusion layer is decreased. That is, the output of the inverter INV2 is decreased from the first power source voltage to the second power source voltage (ground voltage), and the level of the output of the inverter INV2 is switched from the high level to a low level. Simultaneously, the level of the signal supplied to the gate of the inverter INV1 is also switched from the high level to the low level. Since the output of the inverter INV1 is at the low level, both of the nodes Node1 and Node2 are momentarily in the state of the low level. At this time, when the gate potential of the inverter INV1 is increased earlier than the gate potential of the inverter INV2, the node (diffusion layer) of the inverter INV1 is switched to the high level, and the node (diffusion layer) of the inverter INV 2 is switched to the low level. This results in a logical output opposite to the first state. Consequently, the software error occurs.

The effects of the present invention will be described below with reference to FIGS. 9A, 9B and 10.

The semiconductor integrated circuit device according to the first embodiment of the present invention includes the separating well 5 arranged between the proximate data holding circuits in the plurality of data holding circuits and the assistant well 6 arranged to surround the plurality of data holding circuits. In this embodiment, the assistant well 6 is arranged at the two places, respectively, in the direction (the second direction Y) vertical to the direction in which the plurality of data holding circuits are arrayed, and the separating well 5 is arranged like two lines, respectively, in the horizontal direction (the first direction X) in which the plurality of data holding circuits are arrayed. With such configuration, as shown in FIG. 9A, even if one charged particle or ion moves to one direction and this may lead to the influence on the two data holding circuits, the charges are collected by the assistant well 6 arranged in the vertical direction (the second direction Y), thereby enabling the software error to be suppressed.

Moreover, in the semiconductor integrated circuit device according to the first embodiment of the present invention, with the above configuration, even if two charged particles or ions move to two directions and this may lead to the influence on the two data holding circuits, the charges are collected by the assistant well 6 and the separating well 5, thereby enabling the software error to be suppressed.

In this way, according to the semiconductor integrated circuit device according to the first embodiment of the present invention, by providing the separating well 5 and the assistant well 6 between the two data holding circuits, charges (carriers: electrons in this embodiment) generated between the two data holding circuits are collected by the separating well 5 and the assistant well 6, thereby enabling the carriers injected into the two data holding circuits to be reduced. Hence, as shown in FIG. 10, even if a neutron is incident on the Si substrate to cause a nuclear reaction in which two or more kinds of ions are generated at the same time, the separating well 5 and the assistant well 6, which are arranged in the two directions of the horizontal direction (first direction X) and the vertical direction (second direction Y), respectively, can suppress the simultaneous charge injection into the two data holding circuits (the simultaneous charge collection into the node diffusion layers in the two data holding circuits), thereby enabling the probability at which the logics are inverted at the same time to be reduced.

Also, according to the semiconductor integrated circuit device according to the first embodiment of the present invention, when the extension direction of the well in the data holding circuit and the direction of the diffusion layer of the transistor (for example, MISFET) are considered, if the separating well 5 and the assistant well 6 are provided in the two directions, respectively, as mentioned above, the directions of this diffusion layer (the short side direction and the long side direction of the diffusion layer) has no influence. For example, as shown in FIG. 5A, when the ions move in the longitudinal direction of the data holding circuit, if the diffusion layer of the data holding circuit is arranged in the direction of the short side direction, the charge collection amount is small. At this time, even if the separating well 5 and the assistant well 6 are not provided in the direction orthogonal to the longitudinal direction, the influence is small. On the contrary, as shown in FIG. 5B, if the diffusion layer of the data holding circuit is arranged in the direction of the longitudinal direction, the charge collection amount becomes great. In the present invention, even if the directions of the diffusion layer (the direction of a gate electrode, the direction of a channel current, and the like) are arbitrary, the separating well 5 and the assistant well 6 are provided in two directions. Thus, the direction dependence of the diffusion layer on the charge collection amount can be reduced.

(Second Embodiment)

In the second embodiment, the descriptions overlapping with those of the first embodiment will be omitted below.

Figure 6B:
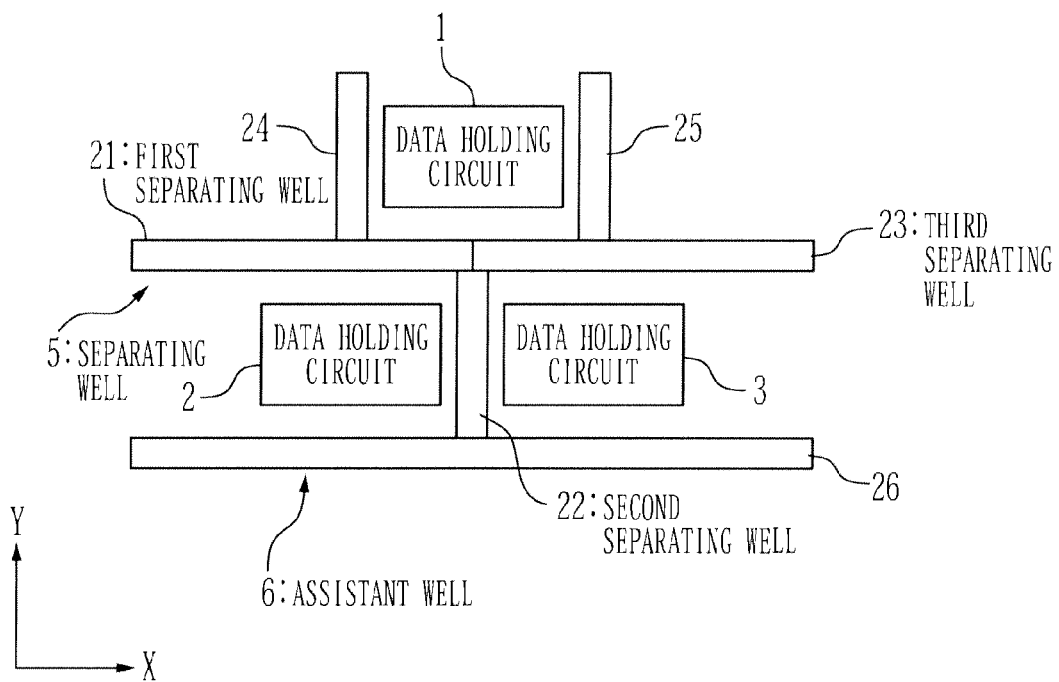
FIG. 6B shows an arrangement of data holding circuits, a separating well and an assistant well in a semiconductor integrated circuit device according to a second embodiment of the present invention.

FIG. 6B shows an arrangement of the data holding circuits 1 to 3, the separating well 5 and the assistant well 6 in the semiconductor integrated circuit device according to the second embodiment of the present invention.

As shown in FIG. 6B, each of the data holding circuits 1 to 3 is arranged to be located at an apex of a triangle on the same flat surface.

The separating well 5 includes P-type or N-type first to third separating wells 21 to 23, instead of the first and second separating wells 13, 14.

The first separating well 21 is provided between the proximate data holding circuits 1 and 2 in the data holding circuits 1 to 3. The second separating well 22 is provided between the proximate data holding circuits 2 and 3 in the data holding circuits 1 to 3. The third separating well 23 is installed between the proximate data holding circuits 1 and 3 in the data holding circuits 1 to 3.

The first separating well 21 is extended in the first direction X parallel to the substrate. The third separating well 23 is connected to the first separating well 21 and extended from the first separating well 21 in the first direction X. Although the first separating well and the third separating well 23 are separately illustrated for convenience, they are integrally formed. The second separating well 22 is connected to a connection portion between the first separating well 21 and the third separating well 23, parallel to the substrate and extended in the second direction Y orthogonal to the first direction X.

The assistant well 6 includes P-type or N-type first to third assistant wells 24 to 26, instead of the first and second assistant wells 11 and 12.

The first assistant well 24 is extended from the first separating well 21 in the second direction Y. The second assistant well 25 is extended from the third separating well 23 in the second direction Y and provided at the position opposite to the first assistant well 24 with regard to the data holding circuit 1, in order to surround the data holding circuit 1. The third assistant well 26 is connected to the second separating well 22 and extended in the first direction X and provided at the position opposite to the first and third separating wells 21 and 23 with regard to the data holding circuits 2 and 3, in order to surround the second and third data holding circuits 2 and 3.

The effects of the present invention will be described below.

The semiconductor integrated circuit device according to the second embodiment of the present invention includes the separating well 5 arranged between the proximate data holding circuits in the plurality of data holding circuits, and the assistant well 6 arranged to surround the plurality of data holding circuits. With such configuration, even if one charged particle or ion moves to the one direction and this may lead to the influence on the two data holding circuits, the charges are collected by the assistant well 6 arranged in the vertical direction (second direction Y). Thus, the software error can be suppressed.

Moreover, in the semiconductor integrated circuit device according to the second embodiment of the present invention, with the above configuration, even if two charged particles or ions simultaneously move to the two directions and this may lead to the influence on the two data holding circuits, the charges are collected by the assistant well 6 arranged in the vertical direction (second direction Y) and the separating well 5 arranged in the horizontal direction. Thus, the software error can be suppressed.

In this way, according to the semiconductor integrated circuit device according to the second embodiment of the present invention, since the separating well 5 and the assistant well 6 are provided between the two data holding circuits, charges (carriers: electrons in this embodiment) generated between the two data holding circuits are collected by the separating well 5 and the assistant well 6. Thus, the carriers injected into the two data holding circuits can be reduced. Hence, even if a neutron is incident on the Si substrate to cause a nuclear reaction in which two or more kinds of ions are generated at the same time, the separating well 5 and the assistant well 6, which are arranged in the two directions of the horizontal direction (first direction X) and the vertical direction (second direction Y), respectively, can suppress the simultaneous charge injection into the two data holding circuits (the simultaneous charge collection into the node diffusion layers in the two data holding circuits), thereby enabling the probability at which the logics are inverted at the same time to be reduced.

(Third Embodiment)

In the third embodiment, the descriptions overlapping with those of the first embodiment will be omitted below.

Figure 7A:
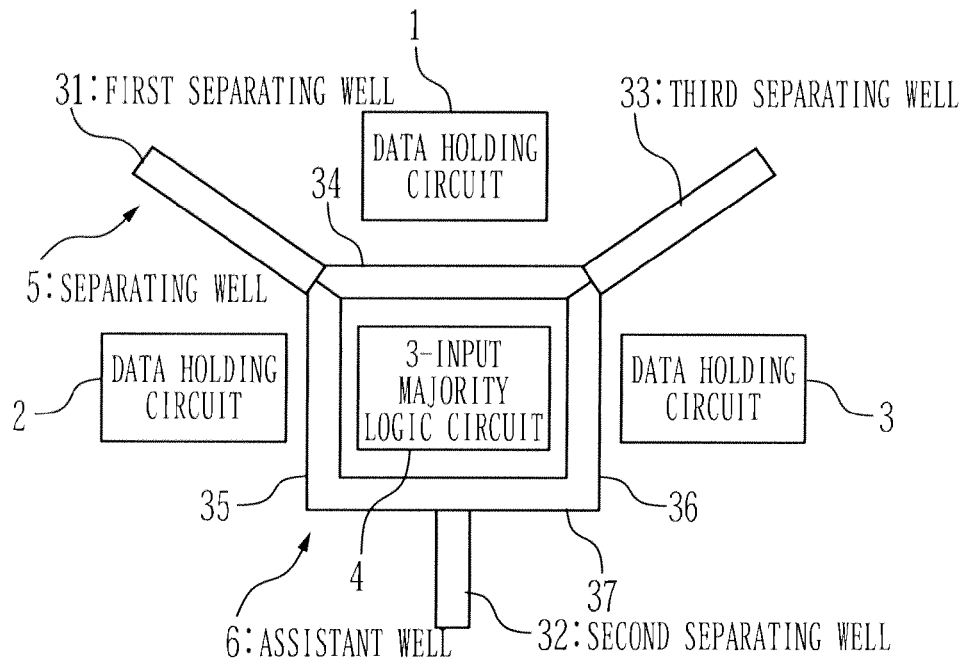
FIG. 7A shows an arrangement of data holding circuits, a 3-input majority logic circuit, a separating well and an assistant well in a semiconductor integrated circuit device according to a third embodiment of the present invention.

FIG. 7A shows an arrangement of the data holding circuits 1 to 3, the 3-input majority logic circuit 4, the separating well 5 and the assistant well 6 in the semiconductor integrated circuit device according to the third embodiment of the present invention.

As shown in FIG. 7A, each of the data holding circuits 1 to 3 is arranged to be located at an apex of a triangle on the same flat surface. The 3-input majority logic circuit 4 is arranged to be located at one of an inner center, a circumcenter, an orthocenter and a center of gravity of the triangle on the same flat surface as the data holding circuits 1 to 3.

The separating well 5 includes P-type or N-type first to third separating wells 31 to 33, instead of the first and second separating wells 13 and 14.

The first separating well 31 is provided between the proximate data holding circuits 1 and 2 in the data holding circuits 1 to 3. The second separating well 32 is provided between the proximate data holding circuits 2 and 3 in the data holding circuits 1 to 3. The third separating well 33 is provided between the proximate data holding circuits 1 and 3 in the data holding circuits 1 to 3.

The assistant well 6 includes P-type or N-type first to fourth assistant wells 34 to 37, instead of the first and second assistant wells 11 and 12.

The first assistant well 34 is connected to the first separating well 31 and the third separating well 33 and provided between the data holding circuit 1 and the 3-input majority logic circuit 4. The second assistant well 35 is connected to the first separating well 31 and provided between the data holding circuit 2 and the 3-input majority logic circuit 4. The third assistant well 36 is connected to the third separating well 33 and provided between the data holding circuit 3 and the 3-input majority logic circuit 4. The fourth assistant well 37 is connected to the second separating well 32, the second assistant well 35 and the third assistant well 36.

Figure 7B:
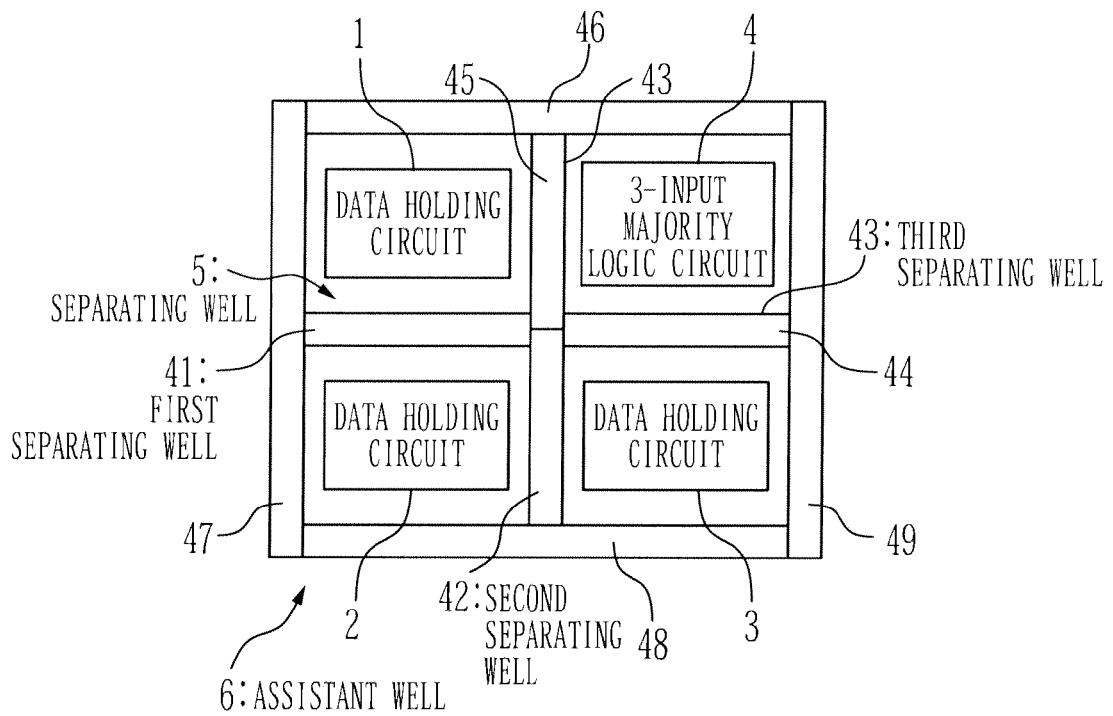
FIG. 7B shows an arrangement of data holding circuits, a 3-input majority logic circuit, a separating well and an assistant well in a semiconductor integrated circuit device according to a variation example in the third embodiment of the present invention.

FIG. 7B shows an arrangement of the data holding circuits 1 to 3, the 3-input majority logic circuit 4, the separating well 5 and the assistant well 6 in the semiconductor integrated circuit device according to the variation example in the third embodiment of the present invention.

As shown in FIG. 7B, each of the data holding circuits 1 to 3 is arranged to be located at an apex of the triangle on the same flat surface. The above triangle is the right-angled triangle. The data holding circuits 1 to 3 and the 3-input majority logic circuit 4 are arranged to be located at the respective apexes of a rectangle on the same flat surface.

The separating well 5 includes P-type or N-type first to third separating wells 41 to 43, instead of the first and second separating wells 13 and 14.

The first separating well 41 is provided between the proximate data holding circuits 1 and 2 in the data holding circuits 1 to 3. The second separating well 42 is provided between the proximate data holding circuits 2 and 3 in the data holding circuits 1 to 3. The third separating well 43 is provided on a route between the proximate data holding circuits 1 and 3 in the data holding circuits 1 to 3.

The first separating well 41 is extended in the first direction X parallel to the substrate. The second separating well 42 is connected to the first separating well 41, parallel to the substrate and extended in the second direction Y orthogonal to the first direction X. The third separating well 43 includes P-type or N-type fourth and fifth separating wells 44 and 45. The fourth separating well 44 is provided between the data holding circuit 3 and the 3-input majority logic circuit 4, connected to the first separating well 41 and extended from the first separating well 41 in the first direction X. Although the first separating well 41 and the fourth separating well 44 are separately illustrated for convenience, they are integrally formed. The fifth separating well 45 is provided between the data holding circuit 1 and the 3-input majority logic circuit 4, connected to the first separating well 41, the second separating well 42 and the fourth separating well 44 and extended from the second separating well 42 in the second direction Y. Although the second separating well 42 and the fifth separating well 45 are separately illustrated for convenience, they are integrally formed.

The assistant well 6 includes P-type or N-type first to fourth assistant wells 46 to 49, instead of the first and second assistant wells 11 and 12.

The first assistant well 46 is connected to the fifth separating well 45, extended in the first direction X and provided at the position opposite to the first and fourth separating wells 41 and 44 in order to surround the data holding circuit 1 and the 3-input majority logic circuit 4. The second assistant well 47 is connected to the first separating well 41 and the first assistant well 46, extended in the second direction Y and provided at the position opposite to the second and fifth separating wells 42 and 45 in order to surround the data holding circuit 1 and the data holding circuit 2. The third assistant well 48 is connected to the second separating well 42 and the second assistant well 47, extended in the first direction X and provided at the position opposite to the first and fourth separating wells 41 and 44 in order to surround the data holding circuit 2 and the data holding circuit 3. The fourth assistant well 49 is connected to the fourth separating well 44, the first assistant well 46 and the third assistant well 48, extended in the second direction Y and provided at the position opposite to the second and fifth separating wells 42 and 45 in order to surround the data holding circuit 3 and the 3-input majority logic circuit 4.

The effects of the present invention will be described below.

The semiconductor integrated circuit device according to the third embodiment of the present invention includes the separating well 5 arranged between the proximate information processing units in the plurality of data holding circuits, and the assistant well 6 arranged to surround the plurality of data holding circuits. With such configuration, even if one charged particle or ion moves to one direction and this may lead to the influence on the two data holding circuits, the charges are collected by the assistant well 6, thereby enabling the software error to be suppressed.

Moreover, in the semiconductor integrated circuit device according to the third embodiment of the present invention, with the above configuration, even if two charged particles or ions simultaneously move to two directions and this may lead to the influence on the two data holding circuits, the charges are collected by the assistant well 6 and the separating well 5, thereby enabling the software error to be suppressed.

In this way, according to the semiconductor integrated circuit device according to the third embodiment of the present invention, since the separating well 5 and the assistant well 6 are provided between the two data holding circuits, charges (carriers: electrons in this embodiment) generated between the two data holding circuits are collected by the separating well 5 and the assistant well 6. Thus, the carriers injected into the two data holding circuits can be reduced. Hence, even if a neutron is incident on the Si substrate to cause a nuclear reaction in which two or more kinds of the ions are generated at the same time, the separating well 5 and the assistant well 6 suppress the simultaneous charge injection into the two data holding circuits (the simultaneous charge collection into the node diffusion layers in the two data holding circuits), thereby enabling the probability at which the logics are inverted at the same time to be reduced.

Also, in the semiconductor integrated circuit device according to the third embodiment of the present invention, by arranging the data holding circuits 1 to 3 and the 3-input majority logic circuit 4 as shown in FIG. 7B, the increase in the layout area can be reduced.

Here, whether or not it is possible to realize the arrangement of FIGS. 7A and 7B will be described below.

The size of the data holding circuit is roughly determined by the number of the transistors configuring its circuit and its W size. The W sizes of the transistors, which configure the data holding circuit and the 3-input majority logic circuit, are not greatly different from each other on average, although they are slightly different from each other. In each of the data holding circuits 1 to 3 (flip-flop circuits) shown in FIG. 1A, the number of the transistors in the simplest circuit configuration is 8. However, in the typical flip-flop circuit or register circuit, since there are a case that a transfer transistor or an inversion output transistor is further added, a case of a master/slave configuration, and other cases, it is configured by the 10 to 20 transistors. The majority logic circuit 4 shown in FIG. 1B is configured by about 20 transistors. For this reason, the size of one data holding circuit is substantially similar to one 3-input majority logic circuit. Hence, the arrangements such as FIGS. 7A and 7B can be attained.

(Fourth Embodiment)

In the fourth embodiment, the descriptions overlapping with those of the first embodiment will be omitted below.

Figure 8A:
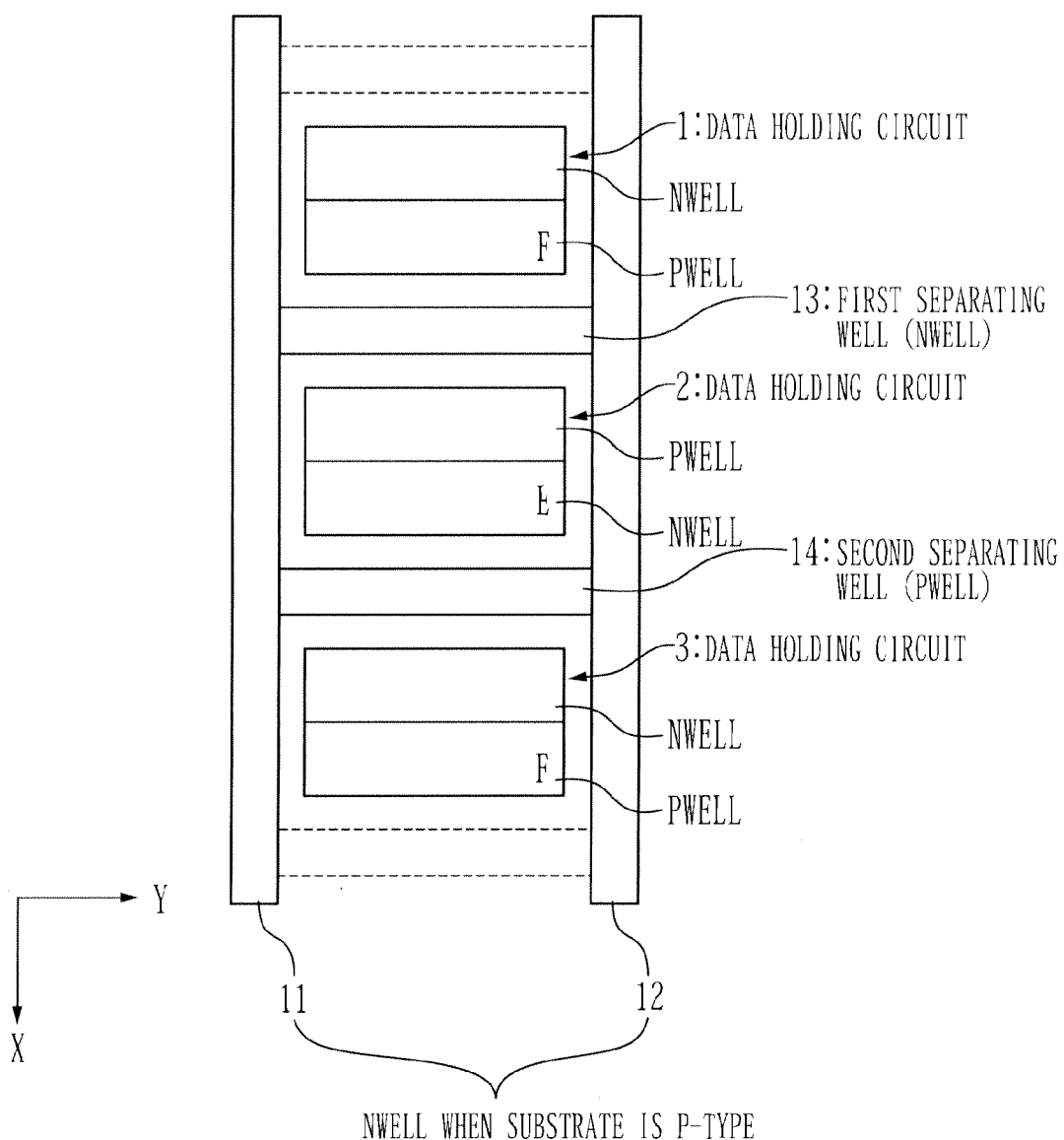
FIG. 8A shows an arrangement of data holding circuits, a separating well (first and second separating wells) and an assistant well (first and second assistant wells) in the semiconductor integrated circuit device according to a fourth embodiment of the present invention.

FIG. 8A shows an arrangement of the data holding circuits 1 to 3, the separating well 5 (the first and second separating wells 13 and 14) and the assistant well 6 (the first and second assistant wells 11 and 12) in the semiconductor integrated circuit device according to the fourth embodiment of the present invention.

As shown in FIG. 8A, the second well "NWELL" and the first well "PWELL" in the data holding circuit 1, the first separating well 13, the first well "PWELL" and the second well "NWELL" in the data holding circuit 2, the second separating well 14, and the second well "NWELL" and the first well "PWELL" in the data holding circuit 3 are arranged in this order in the first direction X. In this case, because the substrate is the P-type, the first assistant well 11 and the second assistant well 12 are the N-type well "NWELL"

Also, since the first well "PWELL" in the data holding circuit 1 and the first well "PWELL" in the data holding circuit 2 are the P-type, the first separating well 13 is the N-type well "NWELL". Since the second well "NWELL" in the data holding circuit 2 and the second well "NWELL" in the data holding circuit 3 are the N-type, the second separating well 14 is the P-type well "PWELL".

The semiconductor integrated circuit device according to the fourth embodiment of the present invention is a variation example of the first embodiment. Thus, with the above configuration, for example, by providing the separating NWELL between the PWELLs of the NMISFETs, it is possible to suppress electrons from being injected into the diffusion layer of the NMISFET.

(Fifth Embodiment)

In the fifth embodiment, the descriptions overlapping with those of the first embodiment will be omitted below.

FIG. 8B shows an arrangement of the data holding circuits 1 to 3, the separating well 5 (the first and second separating wells 13 and 14) and the assistant well 6 (the first and second assistant wells 11 and 12) in the semiconductor integrated circuit device according to the fifth embodiment of the present invention.

As shown in FIG. 8B, the first well "PWELL" and the second well "NWELL" in the data holding circuit 1, the first separating well 13, the second well "NWELL" and the first well "PWELL" in the data holding circuit 2, the second separating well 14, and the second well "NWELL" and the first well "PWELL" in the data holding circuit 3 are arranged in this order in the first direction X. In this case, because the substrate is the P-type, the first assistant well 11 and the second assistant well 12 are the N-type well "NWELL"

Also, since the second well "NWELL" in the data holding circuit 1 and the second well "NWELL" in the data holding circuit 2 are the N-type, the first separating well 13 is the P-type well "PWELL" Since the first well "PWELL" in the data holding circuit 2 and the first well "PWELL" in the data holding circuit 3 are the P-type, the second separating well 14 is the N-type well "NWELL"

The semiconductor integrated circuit device according to the fifth embodiment of the present invention is a variation in the fourth embodiment. Thus, with the above configuration, for example, from the viewpoint of the mobilities of electrons and holes with regard to the arrangement of the three data holding circuits and the arrangements of the separating well 5 and the assistant well 6, the NMISFET (including the node diffusion layer), in which the electron injection is problematic, is arranged as far as possible. In this case, the second separating well 14 may be the N-type well "NWELL" or the P-type well "PWELL". However, the N-type well "NWELL" is preferable.

Here, as for the semiconductor integrated circuit devices according to the first to fifth embodiments of the present invention, their characteristics will be described below.

The semiconductor integrated circuit device according to the embodiments of the present invention includes: a plurality of data holding circuits; and a plurality of wells. The plurality of data holding circuits is provided in a substrate of a first conductive type. Each of the plurality of data holding circuits includes a first well of the first conductive type and a second well of a second conductive type different from the first conductive type. The plurality of wells is arranged in two directions for the each of the plurality of data holding circuits.

The semiconductor integrated circuit device (refer to FIG. 6A) according to the first embodiment of the present invention is characterized in that: in a substrate of a first conductive type, a first data holding circuit 1 and a second data holding circuit 2, which are data holding circuits each including a first well "PWELL" of the first conductive type and a second well "NWELL" of a second conductive type different from the first conductive type, are arranged adjacently in a first direction X; a third well 5 is arranged in an area between the first data holding circuit 1 and the second data holding circuit 2, at a position away from a first side of the first data holding circuit 1 facing the second data holding circuit 2 by a predetermined distance and away from a second side of the second data holding circuit 2 facing the first data holding circuit 1 by the predetermined distance in a second direction Y parallel to the first side and the second side; and fourth wells 6 are arranged at positions away from both sides of the first data holding circuit 1 and the second data holding circuit 2 by a distance approximately equal to the predetermined distance extended to the first direction X.

The semiconductor integrated circuit device is characterized in that the first direction X is substantially perpendicular to the second direction Y.

The semiconductor integrated circuit device is characterized in that the third well 5 and the fourth well 6 are the wells of the same conductive type or the wells of the different conductive types.

The semiconductor integrated circuit device is characterized in that the third well 5 is the same conductive type well or the different conductive type well as compared with the first well "DWELL" or the second well "NWELL"

The semiconductor integrated circuit device is characterized in that the predetermined distance includes a position at which the third well 5 is in contact with both or one of the first well "DWELL" and the second well "NWELL".

The semiconductor integrated circuit device is characterized in that the fourth well 6 is extended in the first direction X, and has approximately the same width as a layout width of the first data holding circuit 1, the third well 5 and the second data holding circuit 2 in the first direction X.

The semiconductor integrated circuit device is characterized in that a fifth well "NWELL", which is deeper than one of the first well "DWELL" and the second well "NWELL", is provided below the first well "PWELL" and the second well "NWELL", and the third well 5 is the fifth well "NWELL".

The semiconductor integrated circuit device (refer to FIGS. 8A and 8B) according to each of the fourth and fifth embodiments of the present invention is characterized in that: in a substrate of a first conductive type, a first data holding circuit 1, a second data holding circuit2 and a third data holding circuit 3, which are data holding circuits each including a first well "PWELL" of the first conductive type and a second well "NWELL" of a second conductive type differing from the first conductive type, are arranged in a first direction X; a third well 13 is arranged in an area between the first data holding circuit 1 and the second data holding circuit 2, at a position away from the first data holding circuit 1 by a predetermined distance and away from the second data holding circuit 2 by a predetermined distance in a second direction Y different from the first direction X; a fourth well 14 is arranged in an area between the second data holding circuit 2 and the third data holding circuit 3, at a position away from the second data holding circuit 2 by a predetermined distance and away from the third data holding circuit 3 by a predetermined distance in the second direction Y; and fifth wells 11, 12 are arranged at positions away from both side of the first data holding circuit 1, the second data holding circuit 2 and the third data holding circuit 3 by a distance approximately equal to the predetermined distance in the same direction as the first direction X.

The semiconductor integrated circuit device is characterized in that the third well 13 and the fourth well 14 are the wells of the same conductive type or the wells of the different conductive types.

The semiconductor integrated circuit device is characterized in that the first direction X is substantially perpendicular to the second direction Y.

The semiconductor integrated circuit device is characterized in that the fifth wells 11 and 12 are the wells of the same conductive type as one of the third well 13 and the fourth well 14.

The semiconductor integrated circuit device is characterized in that the predetermined distance includes a position at which each of the third well 13 and the fourth well 14 is in contact with both or one of the first well "PWELL" and the second well "NWELL".

The semiconductor integrated circuit device is characterized in that each of the fifth wells 11 and 12 is extended in the first direction X, and has approximately the same width as a layout width of the first data holding circuit 1, the third well 13, the second data holding circuit 2, the fourth well 14 and the third data holding circuit 3 in the first direction X.

The semiconductor integrated circuit device (refer to FIG. 6B) according to the second embodiment of the present invention is characterized in that: in a substrate of a first conductive type, a first data holding circuit 1, a second data holding circuit 2 and a third data holding circuit 3, which are data holding circuits each including a first well "PWELL" of the first conductive type and a second well "NWELL" of a second conductive type different from the first conductive type, are arranged at triangular positions; and in each of an area between the first and second data holding circuits 1 and 2, an area between the second and third data holding circuits 2 and 3 and an area between the first and third data holding circuits 1, 3, a well of the same conductive type as the first well "PWELL" or second well "NWELL" is provided between two directions of a layout of the first data holding circuit 1, the second data holding circuit 2 and the third data holding circuit 3.

The semiconductor integrated circuit device is characterized in that the two directions of the layout are perpendicular to each other.

The semiconductor integrated circuit device (refer to FIG. 7A) according to the third embodiment of the present invention is characterized in that: in a substrate of a first conductive type, a first data holding circuit 1, a second data holding circuit 2 and a third data holding circuit 3, which are data holding circuits each including a first well "PWELL" of the first conductive type and a second well "NWELL" of a second conductive type different from the first conductive type, are arranged at triangular positions on the same flat surface; a majority logic circuit 4 is arranged at a substantially central position of the triangular positions; and in each of an area between the first and second data holding circuits 1 and 2, an area between the second and third data holding circuits 2 and 3, an area between the first and third data holding circuits 1 and 3 and an area between the first, second and third data holding circuits 1 to 3 and the majority logic circuit 4, a well independent of the first well "PWELL" and the second well "NWELL" in the first, second and third data holding circuits 1 to 3, or a well connected to at least one of the first well "DWELL" and a second well "NWELL" in the first, second and third data holding circuits 1 to 3 is provided.

The semiconductor integrated circuit device (refer to FIG. 7B) according to the third embodiment of the present invention is characterized in that: in a substrate of a first conductive type, a first data holding circuit 1, a second data holding circuit 2 and a third data holding circuit 3, which are data holding circuits each including a first well "DWELL" of the first conductive type and a second well "NWELL" of a second conductive type different from the first conductive type, and a majority logic circuit 4 are arranged at substantially rectangular positions on the same flat surface; and in each of an area between the first and second data holding circuits 1 and 2, an area between the second and third data holding circuits 2 and 3, an area between the first and third data holding circuits 1 and 3 and an area between the first, second and third data holding circuits 1 to 3 and the majority logic circuit 4, a well independent of the first wells "PWELL" and the second well "NWELL" in the first, second and third data holding circuits 1 to 3, or a well connected to at least one of the first well "PWELL" and the second well "NWELL" in the first, second and third data holding circuits 1 to 3 is provided.

The semiconductor integrated circuit device is characterized in that well potentials set for the data holding circuits 1 to 3 includes at least one of a power source potential, a ground potential and a predetermined potential.

The semiconductor integrated circuit device is characterized in that the data holding circuits 1 to 3 includes at least one of a flip-flop circuit, a latch circuit and a register circuit.

As mentioned above, the semiconductor integrated circuit device according to the present invention includes: a third well arranged between proximate information processing units; and a fourth well arranged to surround a first and second data holding circuits. With such configuration, even if one charged particle or one ion moves in one direction to affect two data holding circuits, charges can be collected by the fourth well arranged in a second direction (Y-direction). Thus, a software error occurrence can be suppressed.

Moreover, in the semiconductor integrated circuit device according to the present invention, with the above configuration, even if two charged particles or two ions simultaneously move in two directions to affect the first data holding circuit and the second data holding circuit, charges can be collected by the fourth well and the third well. Thus, a software error occurrence can be suppressed.

In this way, according to the semiconductor integrated circuit device according to the present invention, the third well and the fourth well are provided between the two data holding circuits so that the third well and the fourth well collect the charges (carriers) generated between the first data holding circuit and the second data holding circuit. Thus, it is possible to reduce the carriers injected into the first data holding circuit and the second data holding circuit. Hence, even if a neutron is incident on a Si substrate so that a nuclear reaction causes two or more kinds of ions to be generated at the same time, the third well and the fourth wells can suppress the charges from being injected into the first data holding circuit and the second data holding circuit simultaneously (simultaneous charge collection at the node diffusion layers in the two data holding circuits), and the probability that the logics are inverted simultaneously can be reduced.

It is apparent that the present invention is not limited to the above embodiment, but may be modified and changed without departing from the scope and spirit of the invention.

Although the present invention has been described above in connection with several exemplary embodiments thereof, it would be apparent to those skilled in the art that those exemplary embodiments are provided solely for illustrating the present invention, and should not be relied upon to construe the appended claims in a limiting sense.

What is claimed is:

1. A semiconductor integrated circuit device comprising:
   a plurality of data holding circuits configured to be provided in a substrate of a first conductive type, each of said plurality of data holding circuits including a first well of said first conductive type and a second well of a second conductive type different from said first conductive type; and
   a plurality of wells configured to be arranged in two directions for said each of said plurality of data holding circuits.

2. The semiconductor integrated circuit device according to claim 1, wherein a first data holding circuit and a second data holding circuit included in said plurality of data holding circuits are arranged adjacently in a first direction, and
   wherein a third well included in said plurality of wells is arranged in an area between said first data holding circuit and said second data holding circuit, at a position away from a first side of said first data holding circuit facing said second data holding circuit by a predetermined distance and away from a second side of said second data holding circuit facing said first data holding circuit by said predetermined distance in a second direction parallel to said first side and said second side, and wherein fourth wells included in said plurality of wells are arranged at positions away from both sides of said first data holding circuit and said second data holding circuit by a distance approximately equal to said predetermined distance extended to said first direction.

3. The semiconductor integrated circuit device according to claim 2, wherein said first direction is substantially perpendicular to said second direction.

4. The semiconductor integrated circuit device according to claim 2, wherein said third well and said fourth well are said wells of said same conductive type or said wells of said different conductive types.

5. The semiconductor integrated circuit device according to claim 2, wherein said third well is said same conductive type well or said different conductive type well as compared with said first well or said second well.

6. The semiconductor integrated circuit device according to claim 2, wherein said predetermined distance includes a position at which said third well is in contact with both or one of said first well and said second well.

7. The semiconductor integrated circuit device according to claim 2, wherein said fourth well is extended in said first direction, and has approximately said same width as a layout width of said first data holding circuit, said third well and said second data holding circuit in said first direction.

8. The semiconductor integrated circuit device according to claim 2, wherein a fifth well, which is deeper than one of said first well and said second well, is provided below said first well and said second well, and said third well is said fifth well.

9. The semiconductor integrated circuit device according to claim 1, wherein a first data holding circuit, a second data holding circuit and a third data holding circuit included in said plurality of data holding circuits are arranged in a first direction, wherein a third well included in said plurality of wells is arranged in an area between said first data holding circuit and said second data holding circuit, at a position away from said first data holding circuit by a predetermined distance and away from said second data holding circuit by a predetermined distance in a second direction different from said first direction, wherein a fourth well included in said plurality of wells is arranged in an area between said second data holding circuit and said third data holding circuit, at a position away from said second data holding circuit 2 by a predetermined distance and away from said third data holding circuit by a predetermined distance in said second direction, and wherein fifth wells included in said plurality of wells are arranged at positions away from both side of said first data holding circuit, said second data holding circuit and said third data holding circuit by a distance approximately equal to said predetermined distance in said same direction as said first direction.

10. The semiconductor integrated circuit device according to claim 9, wherein said third well and said fourth well are said wells of said same conductive type or said wells of said different conductive types.

11. The semiconductor integrated circuit device according to claim 9, wherein said first direction is substantially perpendicular to said second direction.

12. The semiconductor integrated circuit device according to claim 9, wherein said fifth wells and are said wells of said same conductive type as one of said third well and said fourth well.

13. The semiconductor integrated circuit device according to claim 9, wherein said predetermined distance includes a position at which each of said third well and said fourth well is in contact with both or one of said first well and said second well.

14. The semiconductor integrated circuit device according to claim 9, wherein each of said fifth wells is extended in said first direction, and has approximately said same width as a layout width of said first data holding circuit, said third well, said second data holding circuit, said fourth well and said third data holding circuit in said first direction.

15. The semiconductor integrated circuit device according to claim 1, wherein a first data holding circuit, a second data holding circuit and a third data holding circuit included in said plurality of data holding circuits are arranged at triangular positions, and wherein in each of an area between said first and second data holding circuits, an area between said second and third data holding circuits and an area between said first and third data holding circuits, a well included in said plurality of wells of said same conductive type as said first well or second well is provided between two directions of a layout of said first data holding circuit, said second data holding circuit and said third data holding circuit.

16. The semiconductor integrated circuit device according to claim 15, wherein said two directions of said layout are perpendicular to each other.

17. The semiconductor integrated circuit device according to claim 1, further comprising:

a majority logic circuit, wherein a first data holding circuit, a second data holding circuit and a third data holding circuit included in said plurality of data holding circuits are arranged at triangular positions on said same flat surface, wherein said majority logic circuit is arranged at a substantially central position of said triangular positions, and wherein in each of an area between said first and second data holding circuits, an area between said second and third data holding circuits, an area between said first and third data holding circuits and an area between said first, second and third data holding circuits and said majority logic circuit, a well included in said plurality of wells independent of said first well and said second well in said first, second and third data holding circuits, or a well included in said plurality of wells connected to at least one of said first well and a second well in said first, second and third data holding circuits is provided.

18. The semiconductor integrated circuit device according to claim 1, further comprising:

a majority logic circuit, wherein a first data holding circuit, a second data holding circuit and a third data holding circuit included in said plurality of data holding circuits and said majority logic circuit are arranged at substantially rectangular positions on said same flat surface, and wherein in each of an area between said first and second data holding circuits, an area between said second and third data holding circuits, an area between said first and third data holding circuits and an area between said first, second and third data holding circuits and said majority logic circuit, a well included in said plurality of wells independent of said first wells and said second well in said first, second and third data holding circuits, or a well included in said plurality of wells connected to at least one of said first well and said second well in said first, second and third data holding circuits is provided.

19. The semiconductor integrated circuit device according to claim 1, wherein well potentials set for said plurality of data holding circuits includes at least one of a power source potential, a ground potential and a predetermined potential.

20. The semiconductor integrated circuit device according to claim 1, wherein said plurality of data holding circuits includes at least one of a flip-flop circuit, a latch circuit and a register circuit.

* * * * *